US007161377B2

(12) United States Patent
Guillaume

(10) Patent No.: US 7,161,377 B2
(45) Date of Patent: Jan. 9, 2007

(54) BUS TYPE CONNECTION SYSTEM IN PARTICULAR FOR BACKPLANES

(75) Inventor: Sébastien Guillaume, Massy (FR)

(73) Assignee: Alcatel, Paris (FR)

( * ) Notice: Subject to any disclaimer, the term of this patent is extended or adjusted under 35 U.S.C. 154(b) by 106 days.

(21) Appl. No.: 10/948,152

(22) Filed: Sep. 24, 2004

(65) Prior Publication Data
US 2005/0068061 A1    Mar. 31, 2005

(30) Foreign Application Priority Data
Sep. 26, 2003    (FR)    ................................. 03 11281

(51) Int. Cl.
   *H03K 17/16*    (2006.01)
   *H03K 19/003*   (2006.01)
   *H01P 1/24*     (2006.01)
   *H01H 47/32*    (2006.01)
   *H03H 7/38*     (2006.01)

(52) U.S. Cl. ............................ 326/30; 326/26; 326/27; 333/17.3; 333/22 R; 333/142; 333/32; 361/160; 361/170; 361/188; 379/269; 379/290; 379/326; 379/329

(58) Field of Classification Search ................ 326/26, 326/27, 30; 710/300; 333/32, 17.3, 22 R, 333/124; 379/290, 329, 269, 326; 178/45; 370/85; 375/36
See application file for complete search history.

(56) References Cited

U.S. PATENT DOCUMENTS

| 4,475,191 A | * | 10/1984 | James et al. ................. 370/458 |
| 4,858,231 A | * | 8/1989 | Patterson ..................... 333/124 |
| 5,146,192 A | * | 9/1992 | Kondo et al. ................ 333/164 |
| 5,768,692 A | * | 6/1998 | Kwak ............................ 455/83 |
| 6,208,225 B1 | * | 3/2001 | Miller ......................... 333/202 |
| 6,466,008 B1 | | 10/2002 | Fung |
| 6,484,293 B1 | | 11/2002 | Starr |
| 6,552,564 B1 | * | 4/2003 | Forbes et al. .................. 326/30 |
| 6,608,536 B1 | * | 8/2003 | Fallahi ........................ 333/168 |
| 6,998,870 B1 | * | 2/2006 | Gulick et al. .................. 326/30 |
| 2003/0222730 A1 | * | 12/2003 | Watanabe et al. ............. 333/32 |

FOREIGN PATENT DOCUMENTS

EP    0 665 647 A    8/1995

* cited by examiner

*Primary Examiner*—Rexford Barnie
*Assistant Examiner*—Dylan White
(74) *Attorney, Agent, or Firm*—Sughrue Mion, PLLC

(57) ABSTRACT

The invention relates to bus type connection systems, in particular those for wiring backplanes of electronic systems, when the bus comprises connectors distributed in an irregular manner. It consists in selecting segments ($D_1$, $D_2$) over which the intervals ($d_1$, $d_2$) between the connectors are substantially constant. The structure of all the segments except one is then modified to make the effective impedance of the modified segments coincide with that of the unmodified segment. It produces a bus that is fully matched from end to end and able to operate at a very high frequency with a slight reduction of its propagation constant.

6 Claims, 4 Drawing Sheets

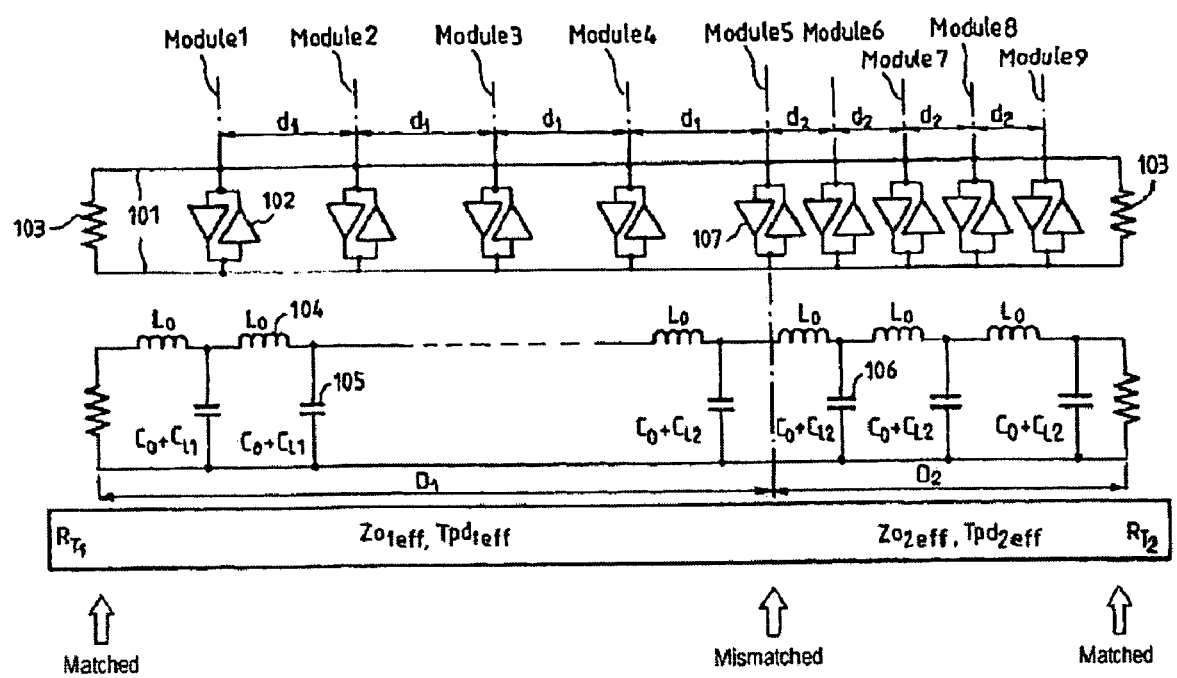
FIG_1

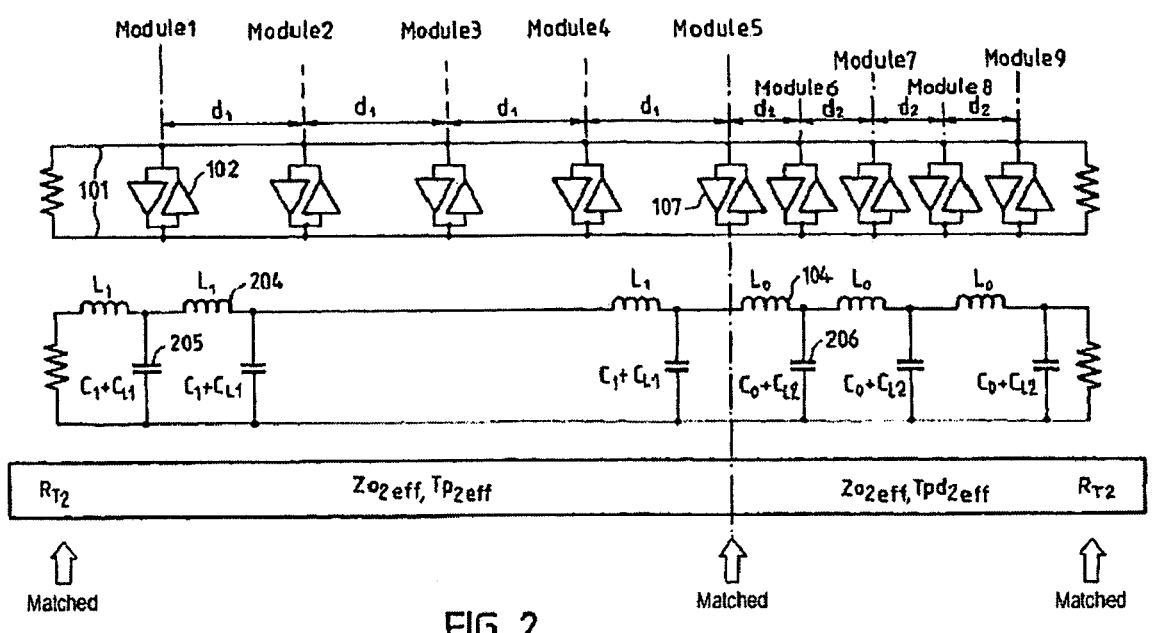
FIG_2

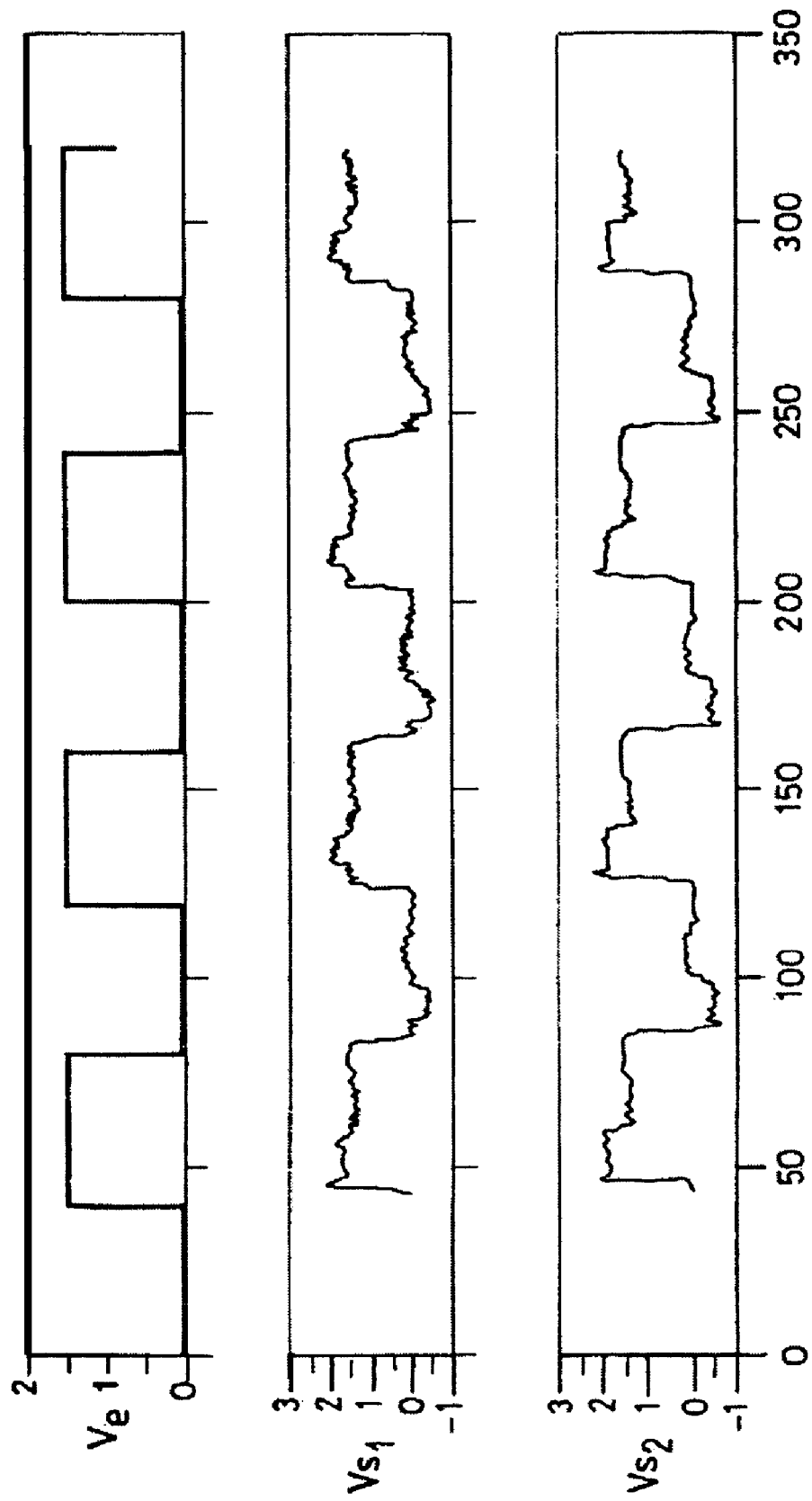
FIG_3

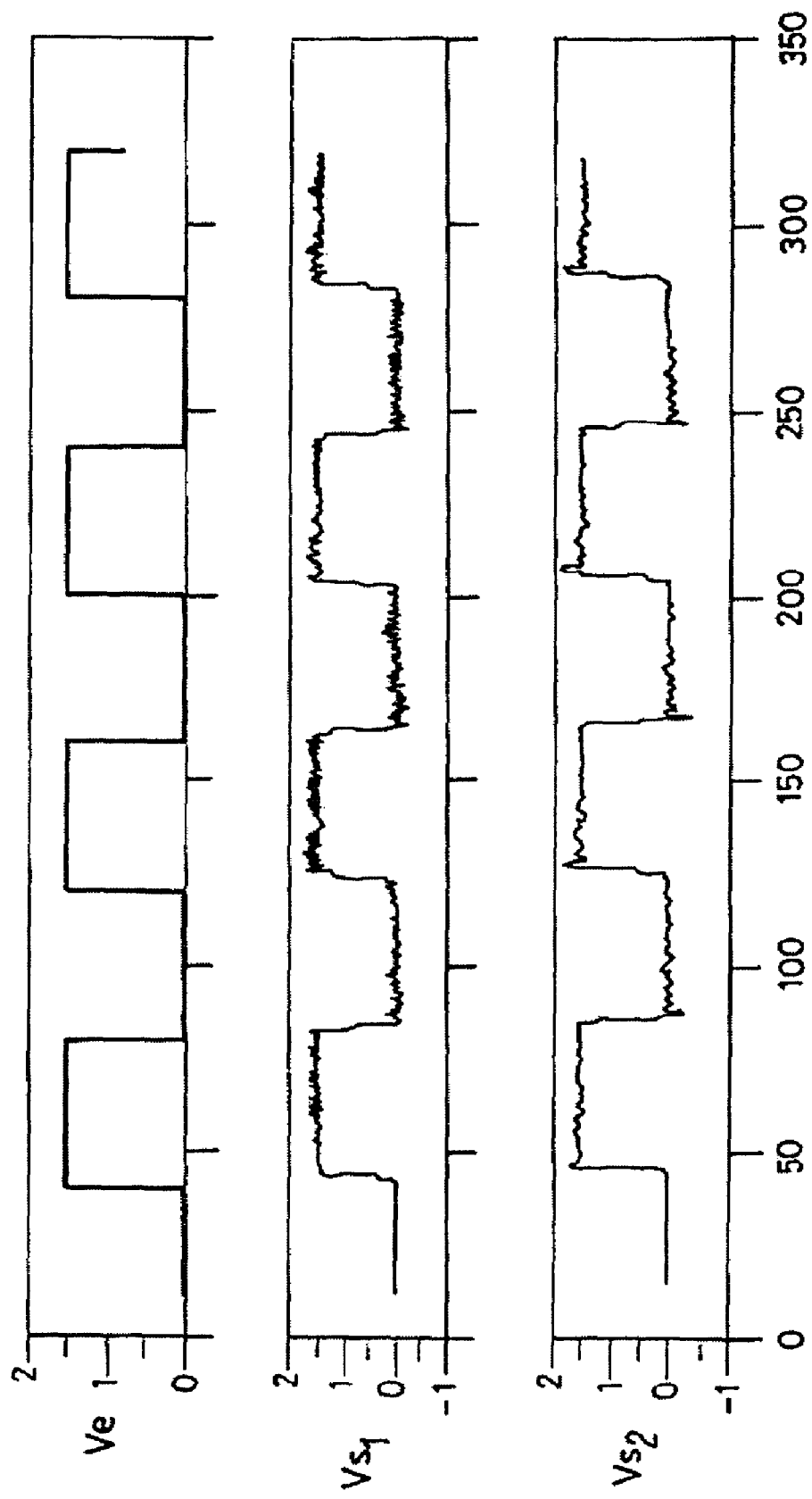
FIG_4

BUS TYPE CONNECTION SYSTEM IN PARTICULAR FOR BACKPLANES

This application claims priority based on 35 U.S.C. §119 to French Application No. 03 11 281, filed on Sep. 26, 2003.

The present invention relates to bus type connection systems, i.e. to connection systems that comprise one or more two-wire lines to which connectors for connecting electronic devices may be fitted anywhere along the line(s). The information that circulates on a line is received or sent over the bus with the aid of a coding system, generally a time coding system, which determines the device to which the information relates. The bus usually comprises a set of lines for transmitting information in parallel. This system is universally used in personal computers (PC) to connect expansion cards. It is also very widely used in professional electronic equipment to wire backplanes into which electronic circuit cards constituting the required hardware are plugged.

The connectors are usually fixed to the backplane at equal intervals and they are connected by electrical conductors that are of exactly the same length from one connector to the next. The resulting combination therefore forms a transmission line or a multiplicity of transmission lines of constant characteristic impedance that transmit signals, in particular digital signals, at very high frequencies with minimum distortion.

In certain particular cases, it is not possible to maintain this equal spacing, and the characteristic impedance along the line is modified as a function of the distance between the connectors. This causes a variation in the propagation time along the line and localized reflections. These phenomena lead to distortion of the transmitted signals and limit the frequency at which signals may be transmitted.

To overcome these limitations, the invention proposes a bus type connection system, in particular for backplanes, comprising a transmission line along which there are connected connectors adapted to receive electronic circuit cards and which comprises at least two segments each comprising a set of connectors disposed at substantially constant intervals that are significantly different from one segment to the next, said electronic circuit cards modifying the impedance of the segment to which they are connected to yield an effective impedance, which system is characterized in that the structure of the transmission line of one segment is modified relative to that of the other segment(s) to make its effective impedance coincide with that of the other segment(s).

The advantage of this solution is that it does not involve any additional manufacturing cost, apart from providing appropriate line parameters along the lines.

According to another feature, the system comprises a set of segments respectively having significantly different intervals between the respective connectors of said segments, and is characterized in that the line structures of all the segments except one are modified relative to a given segment to make their effective impedances coincide with that of the unmodified segment.

According to another feature, the unmodified segment is that for which the effective impedance is the lowest.

According to another feature, the unmodified segment is that for which the distance between the connectors is the shortest.

According to another feature, in which each line takes the form of a conductive track of given thickness, the structure of a line is modified by modifying its width.

According to another feature, the system comprises a set of transmission lines all modified in the same manner.

Other features and advantages of the invention will become clearly apparent on reading the following description, which is given with reference to the appended drawings, in which:

FIG. 1 shows a bus comprising two mismatched portions;

FIG. 2 shows the FIG. 1 bus corrected in accordance with the invention;

FIG. 3 is a graph of the signals on the FIG. 1 bus; and

FIG. 4 is a graph of the signals on the FIG. 2 bus.

FIG. 1 shows diagrammatically one particular embodiment of the invention that corresponds to a backplane bus of total length $D_1+D_2=75$ centimeters (cm). To simplify the explanation, a line relating to only one signal is shown, although it must be understood that a bus generally comprises a greater number of lines, in which case the invention is applied in the same manner to each of the lines forming part of the bus.

With the aim of using the above bus at frequencies of the order of 40 megahertz (MHz), the bus is implemented in a technology, for example strip-line technology employing conductive tracks, such that it takes the form of a transmission line with distributed constants and whose characteristic impedance is determined by the following parameters, for example:

$L_0$=4.73 nanohenries per centimeter (nH/cm); $C_0$=1.06 picofarads per centimeter (pF/cm); $Z_0$=67 ohms ($\Omega$); $T_{pd}$=70.7 picoseconds per centimeter (ps/cm)

The physical representation in the upper portion of the figure shows a set of input/output buffer amplifiers 102 corresponding to cards connected to the line 101 via connectors that are not shown. The ends of this line are looped by matched resistors 103.

For reasons that are specific to this embodiment, the first four input/output amplifiers are fixed at intervals $d_1$ to a first segment of length $D_1$ and the last five amplifiers are fixed at intervals $d_2$ to a second segment of length $D_2$. In the present example, $d_1$=10 cm, $D_1$=50 cm, $d_2$=5 cm and $D_2$=25 cm.

Each of these amplifiers presents to the line, at the location where it is attached, an additional capacitance $C_L$ that in this example is equal to 12 pF.

As shown in the equivalent circuit diagram in the middle portion of FIG. 1, the line behaves as a line with distributed constants and with a series inductance represented by inductors 104 and a parallel capacitance. The inductance is equal to $L_0$ over the whole of the length of the line. The base capacitance of the bus is modified by the capacitances of the amplifiers, over the length $D_1$ to a value represented in the figure by capacitors 105, whose value is equal to $C_0+C_{L1}$, and over the length $D_2$ to a value represented in the figure by capacitors 106, whose value is equal to $C_0+C_{L2}$. The values $C_{L1}$ and $C_{L2}$ are obtained by dividing the constant $C_L$ by the corresponding length, so that $C_{L1}=C_L/d_1$ and $C_{L2}=C_L/d_2$.

As a result, the effective impedance is not the same all along the bus. It is equal to $Zo_{1\mathit{eff}}$ over the length $D_1$ as far as the first module 107 of the second series of modules and to $Zo_{2\mathit{eff}}$ over the length $D_2$ as far as the end of the line. The above values are given by the following equations:

$$Zo_{1\mathit{eff}} = Zo\sqrt{\frac{1}{1+\frac{C_L}{d_1 \cdot C_o}}} \quad Zo_{2\mathit{eff}} = Zo\sqrt{\frac{1}{1+\frac{C_L}{d_2 \cdot C_o}}}$$

The effective propagation delay will be affected in the same manner and therefore:

$$Tpd_{1\mathit{eff}} = Tpd\sqrt{1 + \frac{C_L}{d_1 \cdot C_o}} \quad Tpd_{2\mathit{eff}} = Tpd\sqrt{1 + \frac{C_L}{d_2 \cdot C_o}}$$

As a result, and as represented symbolically in the lower portion of FIG. 1, the bus has an impedance discontinuity at the location of the module 5, corresponding to the transition between the lengths $D_1$ and $D_2$. However, it may be matched at each end by terminating resistors $R_{T_1}$ and $R_{T_2}$ corresponding to the characteristic impedances at these locations.

The invention proposes modifying the structure of the transmission line of the bus over the length $D_1$ so that over this length, allowing for the effect of the input/output amplifiers 102, the effective characteristic impedance over this length is equal to the effective characteristic impedance over the length $D_2$. In this case, as shown in FIG. 2, which uses the same conventions as FIG. 1, the bus, with its amplifiers, is matched end to end. For technical reasons, it is better to reduce the highest impedance rather than to increase the lowest impedance, i.e. that of the segment in which the interval is the shortest.

The structure of the line implementing the bus may be modified simply by modifying its geometry, typically the dimensions of the conductive track(s) that are generally used to implement a bus line. The thickness and the location of each track are often imposed, in which case the structure of a line is modified by modifying only its width.

Taking account of what is physically possible, it is usually necessary to modify at one and the same time the distributed inductance 204 over the length $D_1$, so that it takes some other value, for example a value equal to $L_1$, and the distributed capacitance, so that it takes a value equal to $C_1$, for example. The intrinsic characteristic impedance of this bus portion, i.e. the impedance ignoring the effect of the amplifiers 102, is then equal to $Z_1$. In this case:

$$Zo_{1\mathit{eff}} = Zo_{2\mathit{eff}} = Z_1\sqrt{\frac{1}{1 + \frac{C_L}{d_1 \cdot C_1}}}$$

It may therefore be necessary to alter the two parameters $Z_1$ and $C_1$, which are not totally independent since $Z_1$ depends on $C_1$. In practice, an iterative method may be used that sets a reasonable first value for $C_1$ that is then used to calculate a first value of $Z_1$, for example. This first value of $Z_1$ is used to set the parameters of the bus, for example using an HP_ADS simulator available off the shelf. If the parameters obtained in this way are not suitable, they are modified in a physically acceptable direction, which yields second values of $Z_1$ and $C_1$. The corresponding impedance $Zo_{1\mathit{eff}}$ is then calculated, and will definitely be different from $Zo_{2\mathit{eff}}$. Depending on the direction of the difference, this process is repeated so that it converges until $Zo_{1\mathit{eff}} = Zo_{2\mathit{eff}}$. The effective capacitances 205 and 206 obtained are $C_1 + C_{L1}$ and $C_o + C_{L2}$, respectively.

This method, which has been described in the context of two different intervals, may be generalized to any number of intervals.

To this end, a first step is to determine the minimum effective impedance, i.e. that for the shortest interval, by calculating the impedance for all the sections, each defined by an identical interval between their input/output amplifiers.

The method described above is then applied to each of these sections, identified by the suffix x, to obtain the following equation:

$$Zo_{\min\ \mathit{eff}} = Zo\sqrt{\frac{1}{1 + \frac{C_L}{d_{\min} \cdot C_o}}} = Zo_{x\mathit{eff}} = Zx\sqrt{\frac{1}{1 + \frac{C_L}{d_x \cdot C_x}}}$$

The bus matching terminal resistances are then calculated using methods known in the art. In the particular case of FIG. 2, only the input resistance 203 changes, since only the impedance of the first section changes.

The final step is to verify that the bus behaves correctly with digital signals, preferably by simulation using the simulator referred to above. If the behavior obtained is not good enough, the above operations are repeated to obtain another pair of values $C_1$, $L_1$.

FIG. 3 shows a rectangular input signal $V_e$ and signals $V_{s1}$ and $V_{s2}$ at the fifth module and at the bus output, respectively, in the case of the mismatched bus represented in FIG. 1, and FIG. 4 shows the same signals in the case of the matched bus represented in FIG. 2. The scales are in volts and in nanoseconds. It is found that the improvement is particularly significant.

However, this improvement is obtained to the detriment of the overall transit time on the bus, since the propagation speed for all sections of the bus is reduced to that of the section in which the propagation speed is the lowest.

The above description refers to a situation in which the interval between the connectors of each segment is constant and equal to a precise value $d_1$ or $d_2$. This ideal situation is never encountered in practice, but the invention remains applicable if the intervals are substantially constant, i.e. if they remain close to a mean value that is characteristic of each segment concerned.

The invention claimed is:

1. A bus type connection system, in particular for backplanes, comprising a transmission line (101) along which there are connected connectors adapted to receive electronic circuit cards (102) and which comprises at least two segments ($D_1$, $D_2$) each comprising a set of connectors disposed at substantially constant intervals ($d_1$, $d_2$) that are significantly different from one segment to the next, said electronic circuit cards modifying the impedance of the segment to which they are connected to yield an effective impedance ($Zo_{1\mathit{eff}}$), which system is characterized in that the structure of the transmission line of one segment is modified relative to that of the other segment(s) to make its effective impedance ($Zo_{1\mathit{eff}}$) coincide with that of the other segment(s).

2. A system according to claim 1, comprising a set of segments ($D_1$, $D_2$) respectively having significantly different intervals between the respective connectors of said segments, and characterized in that the line structures of all the segments except one are modified relative to a given segment to make their effective impedances coincide with that of the unmodified segment.

3. A system according to claim 2, characterized in that the unmodified segment is that for which the effective impedance ($Zo_{min\ eff}$) is the lowest.

4. A system according to claim 2, characterized in that the unmodified segment is that for which the distance ($d_2$) between the connectors is the shortest.

5. A system according to claim 1, characterized in that, each line taking the form of a conductive track of given thickness, the structure of a line is modified by modifying its width.

6. A system according to claim 1, characterized in that it comprises a set of transmission lines (101) all modified in the same manner.

\* \* \* \* \*